(12) United States Patent
Lin

(10) Patent No.: US 6,222,237 B1
(45) Date of Patent: Apr. 24, 2001

(54) STRUCTURE OF ELECTROSTATIC DISCHARGE PROTECTION DEVICE

(75) Inventor: Chih-Hung Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/316,584

(22) Filed: May 21, 1999

(51) Int. Cl.⁷ .......................... H01L 23/62; H01L 29/76; H01L 29/00
(52) U.S. Cl. .......................... 257/358; 257/355; 257/360; 257/379; 257/546
(58) Field of Search .................. 257/358, 355, 257/360, 363, 379, 536, 537, 546, 548

(56) References Cited

U.S. PATENT DOCUMENTS

| | | | |
|---|---|---|---|
| 4,847,724 | * | 7/1989 | Renous ................................. 361/91 |
| 5,181,091 | * | 1/1993 | Harrington, III et al. ........... 257/355 |
| 5,406,105 | * | 4/1995 | Lee ..................................... 257/355 |
| 5,760,446 | * | 6/1998 | Yang et al. ......................... 257/357 |
| 5,936,282 | * | 8/1999 | Baba et al. ......................... 257/355 |
| 5,945,714 | * | 8/1999 | Yu ..................................... 257/355 |
| 5,977,596 | * | 11/1999 | Rountree et al. ................... 257/363 |

* cited by examiner

Primary Examiner—Matthew Smith
Assistant Examiner—Lex H. Malsawma
(74) Attorney, Agent, or Firm—Jiawei Huang; J. C. Patents

(57) ABSTRACT

A structure of an ESD protection device located between a pad and an internal circuit. The structure comprises a transistor with a source and a drain connecting to the ground, and an N+ resistor with its cross section comprising an N-well, a P-type doped region located in the N-well, and an N+ doped region located in the P-type doped region. The N+ doped region has a first terminal and a second terminal. The first terminal is connected electrically to the drain and the pad, while the second terminal is connected to the internal circuit.

8 Claims, 2 Drawing Sheets

STRUCTURE OF ELECTROSTATIC DISCHARGE PROTECTION DEVICE

BACKGROUND OF THE INVENTION

1. Field of Invention

The present invention relates to an electrostatic discharge (ESD) protection device of an integrated circuit. More particularly, the invention relates to a resistor that prevents noise interference from an input/output (I/O) pad for an analog signal.

2. Description of Related Art

ESD is often the main cause of integrated circuit (IC) damage in the process of fabricating the IC or after wafer fabrication is complete. For example, a human body walking on a carpet can carry a few hundred to a few thousand volts of electrostatic voltage at a higher relative humidity (RH), while tens of thousand electrostatic volts and above can be carried by the same human body at a relatively lower RH. When such a static electricity carrier comes in contact with a wafer, the discharged static electricity to the wafer probably causes wafer failure. Therefore, various methods to inhibit the electrostatic discharge (ESD) have been developed in order to prevent the ESD from damaging the wafer. The most common method is to inhibit the ESD by hardware, i.e. to design an ESD protection device between the internal circuit and each pad so as to protect the internal circuit.

FIG. 1 is a schematic diagram illustrating a conventional ESD protection circuit. Referring to FIG. 1, the ESD current input by the pad 100 is discharged through a MOS transistor 102 that leads a ground $V_{SS}$ so as to protect an internal circuit 104.

In an analog product, a heavily doped P+ resistor 106 is located between the I/O pad 100 and the internal circuit 104 to prevent noise interference.

FIG. 2 is a cross-sectional diagram showing the structure of the P+ doped resistor 106 in FIG. 1. Referring to FIG. 2, an N-well 110 is formed on a P-type substrate 108, while a P+ doped region 112 is formed in the N-well 110. The P+ doped region 112 is a resistor having a specific resistivity, wherein one end of which is connected to the pad 100 and the transistor 102, and the other end of which is connected to the internal circuit 104. With the N-well 10 serving as isolation, noise interference is prevented.

However, while testing the electrostatic protection device, a positive current is provided from the pad 100. As the P+ resistor 106 is similar to a PN diode with forward bias, it has an activating voltage far lower than the breakdown voltage (BV) of the transistor 102. As a result, the P+ resistor 106 can be activated by the positive current that passes through it. The ESD current is discharged through the P+ resistor 106 and flows into the substrate 108, causing the ESD protection device to fail. If the area of the P+ resistor 106 is too small, the P+ resistor 106 may easily be damaged. However, the die size may be increased if the area of the P+ resistor 106 is increased.

SUMMARY OF THE INVENTION

Therefore, the present invention provides a structure of an ESD protection device. A N+ doped resistor is used to provide a reverse bias, so that no current is discharged from the transistor and passes through the N+ resistor to cause the damage to the resistor.

The invention provides an ESD protection device, which comprises a transistor located between a pad and an internal circuit. The transistor has a drain and a source connecting to the ground. The ESD protection device further comprises an N+ resistor with a cross section comprising an N-well, a P-type doped region located in the N-well, and a N+ doped region located in the P+ doped region. The N+ doped region has a first terminal and a second terminal, with the first terminal connecting electrically to the source and the pad, and the second terminal connecting to the internal circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
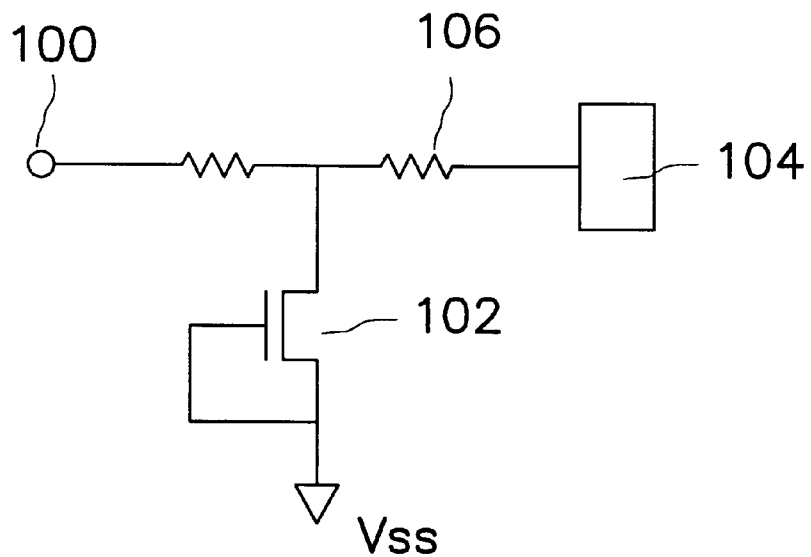
FIG. 1 is a schematic diagram illustrating the conventional ESD protection circuit.
Figure 2:
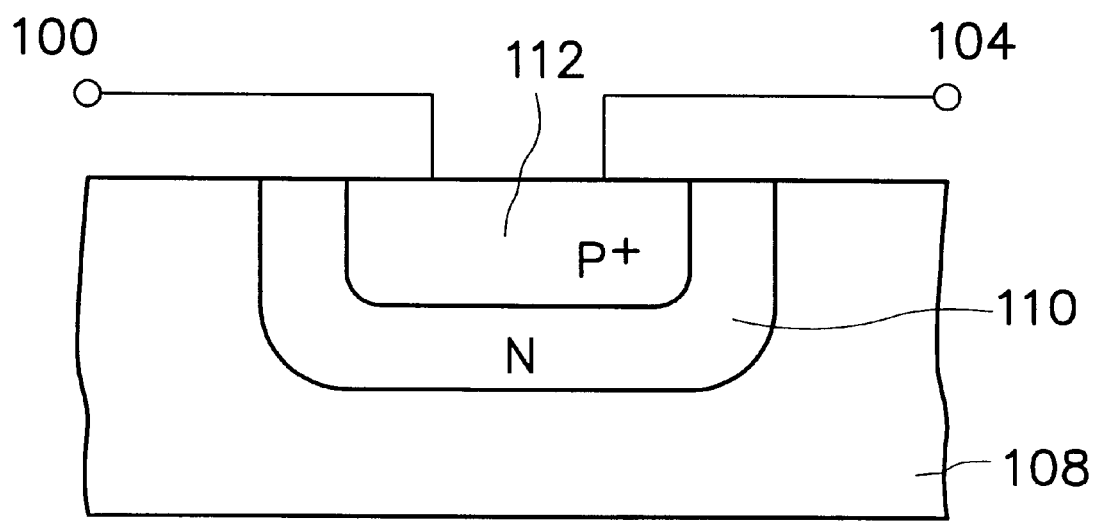
FIG. 2 is a cross-sectional diagram showing the structure of the P+ doped resistor in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
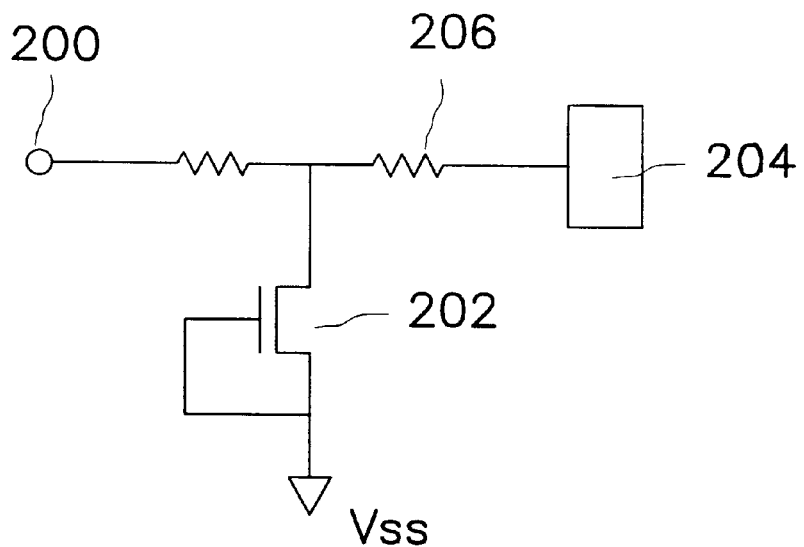
FIG. 3 is a schematic diagram illustrating the ESD protection circuit according to a preferred embodiment.

FIG. 3 is a schematic diagram illustrating the ESD protection circuit according to a preferred embodiment. Referring to FIG. 3, a MOS transistor 202 is connected between a pad 200 and an internal circuit 204. The transistor 202 is connected below the pad 200 by any conventional ESD means. For example, the source is connected to the ground as well as to the gate, while the drain of the transistor 202 is connected electrically to the pad 200. The ESD current input by the pad 200 is discharged through the MOS transistor 202 that leads the ground $V_{SS}$ so as to protect the internal circuit 204. A resistor 206 is located between the I/O pad 200 and the internal circuit 204 to prevent noise interference.

The invention is different from the prior art in that the resistor 206 in the present embodiment uses an N+ doped region as the resistor. As it has a reverse bias, the current discharged through the resistor in the prior art is prevented. The detailed structure of the resistor 206 is illustrated in FIG. 4.

Figure 4:
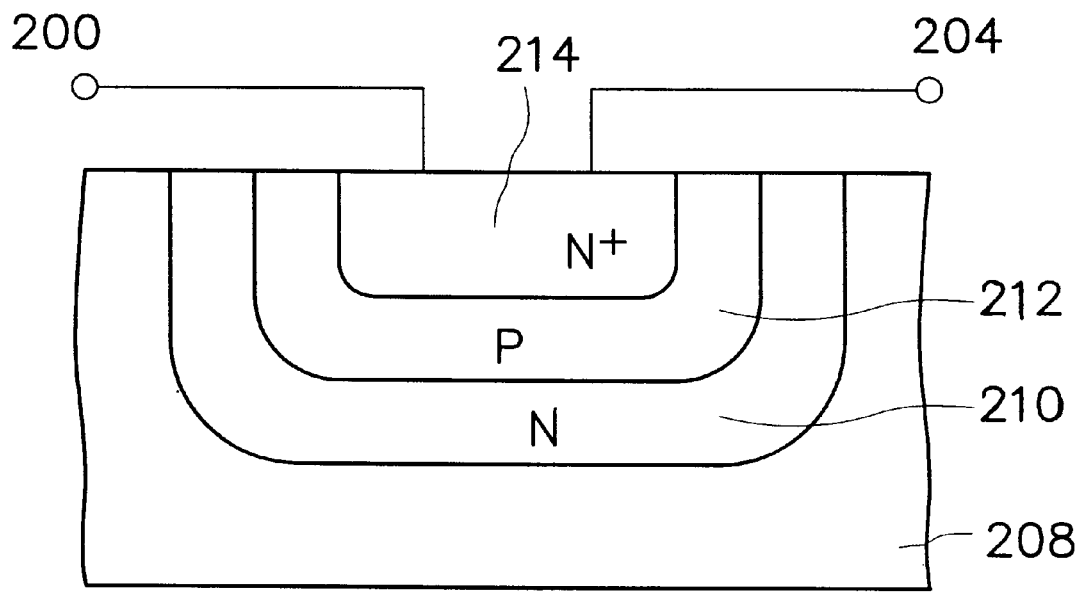
FIG. 4 is a cross-sectional diagram showing the structure of the N+ doped resistor in FIG. 3.

FIG. 4 is a cross-sectional diagram illustrating the cross-sectional views of the N+ doped resistor 206 in FIG. 3. From the diagram, it is seen that an N-well is formed in a P-type substrate, while a P-type doped region 212 is formed in the N-well. An N+ doped region is further formed in the P doped region 212. The N+ doped region 214 is a resistor with a specific resistivity, wherein one end connects to the pad 200 and the transistor 202 (FIG. 3) and the other end connects to the internal circuit 204. With the N-well serving as isolation, noise interference is prevented.

While testing the ESD protection device, a positive current is provided from the pad 200. As the N+ resistor 206 is a NPN structure with a reverse bias, it has an activating voltage higher than the breakdown voltage of the gate of transistor 202. However, the ESD current is still not sufficient to overcome the reverse bias of the N+ resistor even after the ESD current has reached the breakdown voltage of the gate of the transistor 202. The ESD current may therefore be discharged through the transistor 202 instead of the N+ resistor 206. This can effectively prevent the ESD current from flowing into the substrate 108 through the anti-noise resistor. There will also be no failure of the ESD protection device.

It is understood from the above embodiment that the invention can prevent the discharge of the current through the resistor, which occurred in the prior art. The N+ resistor forms a NPN structure and has a reverse bias, so that the discharge current is therefore discharged through the transistor instead of the N+ resistor, which would otherwise damage the resistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of an ESD protection circuit located between a pad and an internal circuit, comprising:

a transistor wherein the transistor has a source and a drain connecting to the ground; and an N+ resistor comprising at least a P-type doped region and a N+ doped region located in the P-type doped region, wherein the N+ doped region has a first terminal and a second terminal, with the first terminal connecting electrically to the source and the pad and the second terminal connecting to the internal circuit, and wherein a positive current is provided from the source such that the positive current from the N+ doped region to the P-type doped region has a reverse bias.

2. The structure of claim 1, wherein the transistor has a gate connecting electrically to the source.

3. The structure of claim 1, wherein the P-type doped region is formed in an N-well.

4. The structure of claim 3, wherein the N-well is formed in a P-type substrate.

5. A resistor structure to prevent noise interference located between a pad and an internal circuit, wherein an ESD protection circuit is located between the pad and the resistor, the resistor at least comprising:

a P-type doped region; and an N+ doped region located in the P-type doped region, wherein the N+ doped region has a first terminal and a second terminal, with the first terminal connecting electrically to a source of a transistor and the pad and the second terminal connecting to the internal circuit, and wherein a positive current is provided from the source such that the positive current from the N+ doped region to the P-type doped region has a reverse bias.

6. The structure of claim 5, wherein the transistor has a gate connecting electrically to the source.

7. The structure of claim 5, wherein the P-type doped region is formed in an N-well.

8. The structure of claim 7, wherein the N-well is formed in a P-type substrate.

* * * * *